(12) United States Patent
Gasse et al.

(10) Patent No.: US 8,866,375 B2
(45) Date of Patent: Oct. 21, 2014

(54) LIGHT EMITTING DIODE COMPONENT

(71) Applicant: Commissariat A L'Energie Atomique Et Aux Energies Alternatives, Paris (FR)

(72) Inventors: Adrien Gasse, Grenoble (FR); Yohan Desieres, Lans en Vercors (FR); Francois Levy, Claix (FR)

(73) Assignee: Commissariat a l' Energie Atomique et aux Energies Alternatives, Paris (FR)

( * ) Notice: Subject to any disclaimer, the term of this patent is extended or adjusted under 35 U.S.C. 154(b) by 8 days.

(21) Appl. No.: 13/654,838

(22) Filed: Oct. 18, 2012

(65) Prior Publication Data
US 2013/0099661 A1    Apr. 25, 2013

(30) Foreign Application Priority Data
Oct. 18, 2011    (FR) ...................................... 11 59383

(51) Int. Cl.
| | | |
|---|---|---|
| *H01J 1/62* | (2006.01) | |
| *H01J 63/04* | (2006.01) | |
| *H01L 33/46* | (2010.01) | |
| *H01L 33/50* | (2010.01) | |
| *H05B 33/10* | (2006.01) | |
| *H05B 33/12* | (2006.01) | |
| *H01L 33/52* | (2010.01) | |

(52) U.S. Cl.
CPC ............... *H05B 33/12* (2013.01); *H01L 33/46* (2013.01); *H01L 33/507* (2013.01); *H05B 33/10* (2013.01); *H01L 33/52* (2013.01)
USPC ............ 313/501; 313/502; 313/506; 313/512

(58) Field of Classification Search
USPC .................................................. 313/498–512
See application file for complete search history.

(56) References Cited

U.S. PATENT DOCUMENTS

| | | | |
|---|---|---|---|
| 6,155,699 A | 12/2000 | Miller et al. | |
| 7,049,740 B2 * | 5/2006 | Takekuma | .................... 313/501 |
| 8,098,011 B2 * | 1/2012 | Shi | ................. 313/512 |
| 2008/0296589 A1 * | 12/2008 | Speier et al. | .................... 257/82 |
| 2009/0001399 A1 | 1/2009 | Diana et al. | |
| 2009/0134412 A1 | 5/2009 | Shylo et al. | |
| 2009/0236619 A1 | 9/2009 | Chakroborty | |
| 2011/0089455 A1 | 4/2011 | Diana et al. | |
| 2011/0210367 A1 * | 9/2011 | Kim | ................. 257/98 |
| 2012/0132944 A1 * | 5/2012 | Hsieh et al. | .................... 257/98 |
| 2012/0319575 A1 * | 12/2012 | Nakamura et al. | ............ 313/512 |

OTHER PUBLICATIONS

French Preliminary Search Report and Written Opinion issued May 24, 2012, in French 1159383, filed Oct. 18, 2011 (with English Translation of Categories of Cited Documents).

* cited by examiner

*Primary Examiner* — Nimeshkumar Patel
*Assistant Examiner* — Jose M Diaz
(74) *Attorney, Agent, or Firm* — Oblon, Spivak, McClelland, Maier & Neustadt, L.L.P.

(57) ABSTRACT

A light-emitting diode component includes a primary source, a conversion layer forming a secondary source configured for absorbing the primary radiation at least in part and emitting a secondary radiation, an encapsulation layer, situated between the primary and secondary sources. The light-emitting diode component also includes a reflection layer (i) situated between the encapsulation layer and the conversion layer and having a face in contact with the encapsulation layer so as to form an interface with the encapsulation layer, the reflection layer (i) and the encapsulation layer being configured so that the interface allows the primary radiation originating from the primary source to pass and reflects the secondary radiation toward the outside of the light emitting diode.

29 Claims, 4 Drawing Sheets

LIGHT EMITTING DIODE COMPONENT

TECHNICAL FIELD OF THE INVENTION

This invention relates to light-emitting diodes in general and more particularly to those that are designed to emit a light from a primary source and from a secondary source which absorbs a part of the radiation from the primary source and which reemits its own radiation. This application covers for example for application light-emitting diodes emitting a white light.

STATE OF THE ART

Light-emitting diodes, or LED, acronym for the English "light-emitting diode," produced since the sixties by the microelectronics industry have seen their field of application broaden with the passing years. Lighting, as replacement for incandescent lamps, and more sophisticated applications such as backlighting for liquid crystal displays, now form part of the field of application of LEDs. These applications require being able to have white LEDs. By the very fact of the physical operating principle of LEDs, there is, however, no single diode capable of emitting in the full spectrum of visible wavelengths, that is to say, approximately, between 400 and 800 nanometers (nanometer or nm=$10^{-9}$ meter).

A widely used technique for producing a white light consists in utilizing a LED, usually referred to as "LED chip," emitting in a part of the spectrum, the LED chip being incorporated within a component usually referred to as "LED component" or "light-emitting diode component." The LED chip constitutes a primary source of photons which are in part transmitted and in part absorbed by a luminescent material incorporated into the LED component close to the primary source. The luminescent material, which constitutes a secondary source of photons, reemits the light in a greater range of wavelengths. The whole is perceived by the human eye as a white light.

Ever since it has been known how to make LEDs emitting in blue, the primary source more often than not has been an LED chip the semiconductor of which is gallium nitride (GaN) emitting in a range of wavelengths on the order of 450 nanometers. The secondary source is chosen to emit in yellow. The luminescent material typically is YAG:Ce, acronym for the English "Yttrium Aluminum Garnet" referring to "yttrium and aluminum garnet" doped with cerium (Ce). As shown on FIG. 1, radiation 110 originating from the blue primary source and radiation 120 originating from the yellow—complementary color of blue—secondary source, combine to yield a light which then appears to the human eye as white.

YAG generally is available in the form of powder which is mixed with an organic polymer matrix of epoxy or silicone type, or even with an inorganic material such as glass. The YAG then constitutes luminophores included in the coating material. FIG. 2 illustrates a standard structure for a white LED component 100 functioning according to the principles briefly set forth above. In this particular exemplary implementation, luminophores 31 are transported into a layer 3 situated at a distance from the primary source, blue LED chip 1, which for this purpose is coated in a layer 2 of an encapsulating material 21. Layer 3 is referred to as conversion layer.

In such a structure, a part 111 of the radiation emitted by the primary source is transmitted directly. The other part 112 is absorbed by luminophores 31 which reemit a secondary radiation. In the structure such as the one illustrated on FIG. 2, where the luminophores are transported, half 121 of the converted radiation then is actually reemitted directly toward the outside of the device. The other half 122 is reemitted toward the inside. A part 123 of the secondary radiation reemitted toward the inside 122 nevertheless also is going to be able to contribute to the white light emitted by being sent back toward the outside by inner reflective walls 11 of support 10 forming a casing and in this way improving the luminous efficiency of the device. The larger the surface of the reflective walls considering that of LED chip 1, the greater the improvement. A large distance between luminophores 31 and the chip also makes it possible to improve the luminous efficiency. Nevertheless, insofar as it is sought at the same time to reduce the size of the casings, the improvement achieved in terms of efficiency generally is rather slight; at best it typically is on the order of 15%.

Reflection of the secondary radiation toward the outside therefore is far from being total, which does not make it possible to attain optimal luminous efficiency from such a device. The secondary radiation that remains confined in the device also contributes significantly to its overheating which is detrimental to the service life of the device and to its functioning. In particular, the most powerful LED chips must have recourse to substantial heat sinks to maintain their junction temperature at a level where optical electrical conversion takes place with the best possible output.

Many improvements have been proposed for this type of LED components which delivers a white light by using a conversion layer containing a luminescent material. Nevertheless, in general they considerably complicate the manufacturing process. For example, in the patent application entitled "Encapsulation for phosphor-converted white light emitting diode" and published under the number US 2009/0272996, it is indicated that light extraction is greatly improved by using nanoparticles that are introduced into the conversion layer so as to adjust the index of refraction thereof. A spacing layer between primary and secondary source also is described, which contributes to obtaining a better extraction of the light produced in particular from the secondary source but is not basically different from layer 2 described above. The formation and introduction of nanoparticles into the conversion layer nevertheless requires having recourse to a sophisticated technology which is poorly adapted to a low-cost mass production of such white LEDs.

Another example of improvement obtained is described in a publication entitled "Enhanced forward efficiency of Y3Al5O12:Ce3+ phosphor from white light-emitting diodes using blue-pass yellow-reflection filter," published on Apr. 27, 2009 in "OPTICS EXPRESS," Volume 17, Number 9, by Jeong Rok Oh et al., Kookmin University, chemistry department, Seoul 136-702, South Korea. This publication reports the use of optical filters, placed between the primary source emitting in blue and the secondary source emitting in yellow, and intended to reflect the yellow light while allowing the blue light to pass so as to improve the extraction efficiency of the light. The use of filters which consist of a stack of many layers of silicon oxide (SiO2) and titanium oxide (TiO2) the thicknesses of which must be carefully controlled so as to produce the luminous interferences sought for the filtering function, is difficult to say the least. There too, it is necessary to set up a complex manufacturing process which is incompatible with a low-cost production of devices.

It is therefore an object of the invention to describe a manufacturing process simple to use and which nevertheless makes it possible to significantly improve the extraction efficiency of the light of a LED component comprising a conversion layer containing a luminescent material.

The other objects, characteristics and advantages of this invention will become apparent upon examination of the following description and the accompanying drawings. It is understood that other advantages may be incorporated.

SUMMARY OF THE INVENTION

One aspect of this invention relates to a light-emitting diode component (LED component) comprising: at least one primary source configured for emitting a primary radiation when it is activated electrically; at least one conversion layer forming a secondary source configured for absorbing the primary radiation at least in part and emitting a secondary radiation; at least one encapsulation layer which is situated at the contact of the primary source and which is configured for allowing the primary radiation to pass. The component also comprising at least one reflection layer situated between the encapsulation layer and the conversion layer and having a face in contact with the encapsulation layer so as to form an interface with the encapsulation layer; the reflection layer and the encapsulation layer being configured so that the said interface is adapted for allowing the primary radiation to pass and for reflecting toward the outside of the light-emitting diode component all the secondary radiation emitted by the conversion layer and which reaches the said interface forming, with a perpendicular to the said interface, an angle greater than the angle of total reflection $\text{Arcsin}(n_2/n_i)$, $n_2$ and $n_i$ being the respective indexes of refraction of the encapsulation layer and the reflection layer. All the beams of secondary radiation that reach the interface with an angle greater than this angle of total reflection therefore are reflected by total reflection.

In this way the combination of the encapsulation layer and the reflection layer makes it possible to form an interface capable of extracting outside the light-emitting diode all or part of the secondary radiation being propagated toward the primary source or the inside of the LED component. The secondary radiation blocked and reflected toward the outside by the said interface comes from the secondary source either directly or by reflection.

In the context of this invention, it has been identified that in the existing LED components, the roughness of the conversion layer forming the secondary source, when this layer is in contact with an encapsulation or spacing layer disposed in contact with the primary and secondary sources, limits the extraction of the radiation outside the LED component. As a result of this roughness of the conversion layer, a part of the radiation reemitted by this secondary source therefore penetrates toward the inside of the LED component. This roughness is mainly due to the size of the particles of luminophore material present in the conversion layer. In order to reduce the roughness of this layer, it would be necessary in particular to reduce the size of the particles, replacing them for example with luminophore nanoparticles. In the context of this invention, it turned out that this modification of the conversion layer leads to an increased achievement complexity and cost for the LED component.

In this way, the invention, by creating a new interface decorrelated from the conversion layer forming the secondary source, makes it possible to achieve an improved extraction without having to reduce the roughness of this conversion layer.

The output of the diode consequently is improved without need for precisely controlling the roughness of the conversion layer forming the secondary source.

The invention further makes it possible to remove the heavy constraints on the thicknesses of the different layers, these constraints being unavoidable in the solutions based on interference effects.

In this way the invention makes it possible to produce high-output LED components more easily and at lower cost.

According to another embodiment, the invention relates to a lighting, display or signaling system or a device comprising at least one light-emitting diode component according to any one of the preceding characteristics.

According to another embodiment, the invention relates to a method for manufacturing a light-emitting diode component, the method comprising the following steps: disposing a primary source configured for emitting a primary radiation appearing when it is activated electrically; disposing a conversion layer forming a secondary source configured for absorbing the primary radiation at least in part and emitting a secondary radiation; disposing an encapsulation layer between the primary and secondary sources and configured for allowing the radiation emitted by the primary source toward the secondary source to pass; disposing a reflection layer between the encapsulation layer and the conversion layer so that a face of the reflection layer is in contact with the encapsulation layer to form an interface with the encapsulation layer; choosing the reflection layer and the encapsulation layer so that the interface formed by the reflection layer and by the encapsulation layer is adapted for allowing the primary radiation originating from the primary source to pass and for reflecting the secondary radiation, completely or at least in part, toward the outside of the light emitting diode component.

Optionally, the method further comprises one or more of the following elective steps:

the primary source is fixed in a casing forming a cavity;

According to a first embodiment, the encapsulation layer and the conversion layer are dispensed in liquid form in the casing. Advantageously, the cross-linking and solidification of the encapsulation layer and of the conversion layer are achieved thermally. Advantageously, the reflection layer is deposited by vapor phase chemical or physical process (PVD or CVD).

According to a first embodiment, the steps of deposition of the conversion layer, the reflection layer and the encapsulation layer respectively comprise a step of depositing the conversion layer in a mold having a dome shape, a step of depositing the reflection layer on the conversion layer, a step of depositing the encapsulation layer on the reflection layer. Advantageously, the method further comprises a step of transferring the LED chip into the layer of the encapsulation layer. The method preferably comprises, prior to the step of transferring the LED chip into the layer of the encapsulation layer, a step of fixing the LED chip onto a flat or convex support.

the conversion layer is disposed in contact with the reflection layer. The method comprises a step of increasing the roughness at the interface between the conversion layer and the reflection layer. This roughness Ra preferably is greater than 50 nm. In this way the method according to the invention makes it possible to impart a diffusing nature to this interface.

the step of increasing the roughness at the interface between the conversion layer and the reflection layer comprises at least a plasma etching and/or a chemical etching.

BRIEF DESCRIPTION OF THE FIGURES

The purposes, objects, as well as the characteristics and advantages of the invention will become more apparent from the detailed description of an embodiment thereof which is illustrated by the following companying drawings in which.

Figure 1:
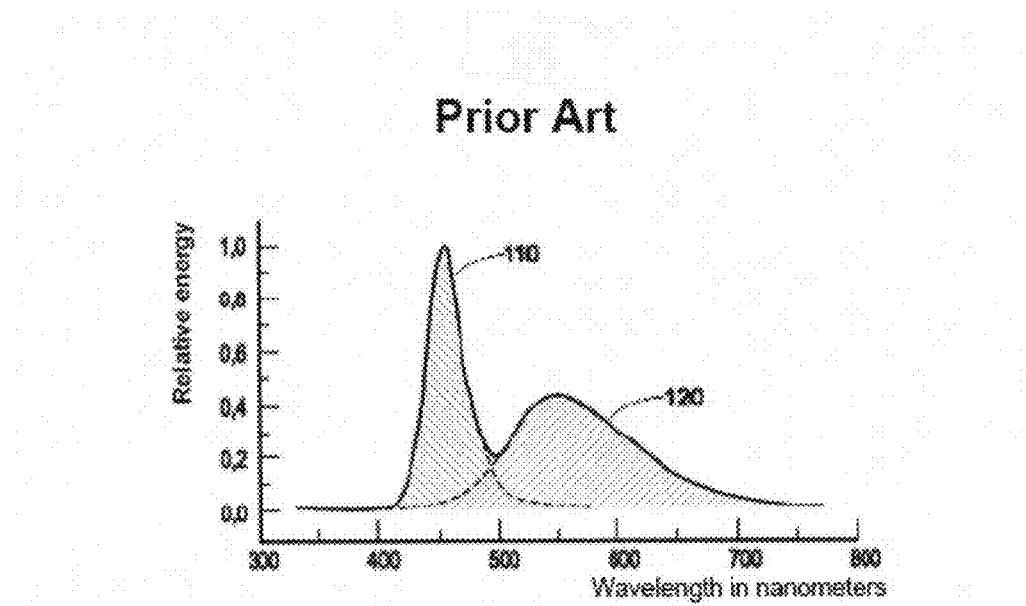
FIG. 1 illustrates the prior art and the method for production of a white light from a colored primary source and a secondary conversion source using a luminescent material.

The attached drawings are provided by way of examples and are not limitative to the invention.

DETAILED DESCRIPTION OF THE INVENTION

Before undertaking a detailed review of the embodiments of the invention, optional characteristics which may be used in combination or alternatively, if need be, are set forth below:

The said face of the reflection layer has a roughness Ra less than 50 nm and preferably less than 5 nm. The roughness Ra is defined as the mean arithmetic deviation. It is usually measured by means of an atomic force microscope (AFM) for example.

The index of refraction ni of the reflection layer is greater than the index n2 of the encapsulation layer. The reflection layer and the encapsulation layer preferably are configured so that ni/n2>1.2. Even more preferentially, the reflection layer and the encapsulation layer are configured so that ni/n2>1.4.

By using only the characteristics (indexes of refraction and roughness in particular) of the intermediate layer and the encapsulation layer, it is possible in this way to achieve a specular or almost specular behavior at the said interface. Extraction of the radiation outside the diode therefore is optimized and the output considerably improved.

Furthermore the invention makes it possible to achieve a high extraction while minimizing the dimensions of the LED component. In fact, the invention does not require greatly distancing the secondary source from the primary source.

The conversion layer forming a secondary source and the reflection layer are configured so that the index of refraction $n_3$ of the conversion layer is greater than the index of refraction $n_i$ of the reflection layer.

The reflection layer preferentially is disposed in contact with the secondary layer. The light-emitting diode component thus comprises a sole reflection layer. There is only one layer between the encapsulation layer and the secondary source. In this way the implementation method is simplified. The quality of the interface is better controlled and it is made more reliable.

The reflection layer is more or less transparent to the primary radiation. The reflection layer preferably has an optically homogeneous behavior. It may be monolithic, that is to say made of a sole material, or made of a stack of materials with equal optical indexes.

The encapsulation layer is disposed in contact with the primary source.

Advantageously, the encapsulation layer is adapted for shaping the beam formed by the radiation emitted by the primary source. For example, the encapsulation layer may have a hemispherical shape.

The reflection layer preferably is made of a material comprising at least one of the materials taken from among: zinc sulfide (ZnS), zinc oxide (ZnO), titanium oxide ($TiO_2$), tin and indium oxide (ITO), indium oxide ($In_2O_3$), zirconium oxide ($ZrO_2$), hafnium oxide ($HfO_2$), silicon nitride ($Si_3N_4$) and tantalum oxide ($Ta_2O_5$). The encapsulation layer preferably is made of a material comprising at least one of the materials taken from among: an organic polymer of silicone, epoxy or acrylic type, an inorganic material such as glass. The primary source preferably comprises a chip comprising a material taken from among: gallium nitride (GaN), indium and gallium nitride (InGaN), aluminum nitride (AlN), aluminum and gallium nitride (AlGaN), or InAlGaN, zinc oxide (ZnO), GaP, GaAsP, InGaAlP.

The encapsulation layer is in contact with the LED chip. It surrounds the latter at least in part.

According to an embodiment, the LED chip is disposed on a support such as a casing for example and the material forming the encapsulation layer is, for example, poured onto the LED chip so as to encapsulate it.

According to another embodiment, the LED chip is disposed on a support. As regards the material forming the encapsulation layer, it is disposed on a stack of layers comprising the conversion layer and the reflection layer. The LED chip and its support then are added onto the stack so as to immerse the LED chip in the encapsulation layer.

A sole interface is provided in order to ensure reflection of the secondary radiation. At least 70% of the secondary radiation preferably is reflected at this sole reflection interface. In this way the invention makes it possible to do without a complex structure requiring the superposition of a great number of interfaces each forming a filter.

The secondary source is in the form of a conversion layer.

The secondary source comprises, at least in part, a luminescent material.

The conversion layer preferably comprises a matrix inside of which particles of the luminescent material are accommodated. These particles are referred to as luminophores. Advantageously, the matrix is made of silicone, and the luminescent material is a cerium-doped yttrium and aluminum garnet (YAG:Ce). The particles typically have a size ranging between 0.05 and 50 μm and preferably between 0.05 and 30 μm. Particularly advantageously, the particles include or are nanophosphors the size of which is typically less than 500 nanometers or even less than 100 nanometers. The matrix preferably has an index of refraction nm such that $n_m >= n_2$.

Alternatively, the secondary source forms an optically homogeneous layer.

The secondary source forms a layer the index of refraction $n_3$ of which is such that $n_3 > n_2$.

The LED component comprises a stack of superposed layers. The encapsulation layer tops the LED chip, the reflection layer tops the encapsulation layer and the conversion layer tops the reflection layer. Advantageously, the thickness $e_2$ of the encapsulation layer, the thickness $e_i$ of the reflection layer and the thickness $e_3$ of the conversion layer are such that $e_2 > \lambda/n_2$, $e_i > \lambda/n_i$, $e_3 > \lambda/n_3$, $n_2$, $n_i$ and $n_3$ being respectively the indexes of refraction of the encapsulation layer, the reflection layer and the conversion layer and λ being the highest wavelength of the wave range of the radiation emitted by the component.

Advantageously, the thickness of the encapsulation layer ranges between 0.5 μm and 5 mm and preferably is approximately 375 μm. Preferentially, in order to achieve properties of non-reflection from the encapsulation layer onto the interface with the primary source, the thickness of the encapsulation layer will be chosen such that $e_2=\lambda/4n_2+j$. $\lambda/2$ or j is an integer able to assume a value from 0 to infinity. The thickness of the reflection layer ranges between 0.4 μm and 5 μm and preferably is approximately 500 nm. These thickness are relatively large and do not impose marked constraints in the manufacturing process. Furthermore, they do not need to be controlled with a great precision.

The said interface preferably is more or less flat. The reflection layer preferably is more or less flat.

The secondary source preferably forms a layer an outer face of which is turned toward the outside of the LED component, this outer face having a roughness greater than 50 nm. Advantageously, the structuring created by the roughness of the outer face makes it possible to achieve a diffusive behavior of the LED component.

Alternatively or concurrently, the secondary source forms a layer an outer face of which is turned toward the outside of the LED, and the LED comprises a hemispherical lens disposed between the said outer face and the outside. The lens typically is disposed in contact with the layer forming a secondary source. It preferably is made of a material chosen from among: glass or a transparent or more or less transparent organic polymer material.

Preferentially, the primary source, the encapsulation layer and the reflection layer at least are accommodated in a cavity. The cavity preferably is formed by a casing having reflective inside walls, typically made of metal or in a polymer material forming a reflector. The secondary source preferably also is accommodated in the casing.

According to a specific embodiment, the cavity is formed by the secondary source. The primary source preferably then rests on a support, typically a metal base.

According to an alternative embodiment, the primary source rests on a support having a flat shape. This embodiment is particularly simple and inexpensive to implement.

According to an alternative embodiment, the primary source rests on a support having a convex shape. This embodiment makes it possible to have an indicator of emission greater than 180°.

For the embodiments in which the support is flat or convex, a mold preferably is provided to be disposed, inside of which the materials forming the different layers are cast, the LED chip then being added into the encapsulation layer.

The primary source and the secondary source preferably each emit more or less monochromatic radiations. Alternatively, the primary source and the secondary source emit radiations in ranges of wavelengths. The ranges of primary and secondary radiations may have common wavelengths. Alternatively, these two ranges do not overlap and the primary and secondary radiations have different wavelengths.

The primary wavelength emitted by the primary source preferably is less than the secondary wavelength emitted by the secondary source.

In this invention, there is designated as chip or LED chip a luminous source emitting a primary flux when it is activated. A chip typically has a thickness less than a few hundred micrometers. There is designated by LED component a light emitting diode component or LED module, an assembly 100 comprising at least one LED chip forming a primary source 1 (or LED layer), a secondary source comprising one or more luminescent materials and a casing or support 10 containing and/or onto which are added primary source(s) 1 and the secondary source. Assembly 100 is usually described as LED chip or LED chip in English.

Figure 3:
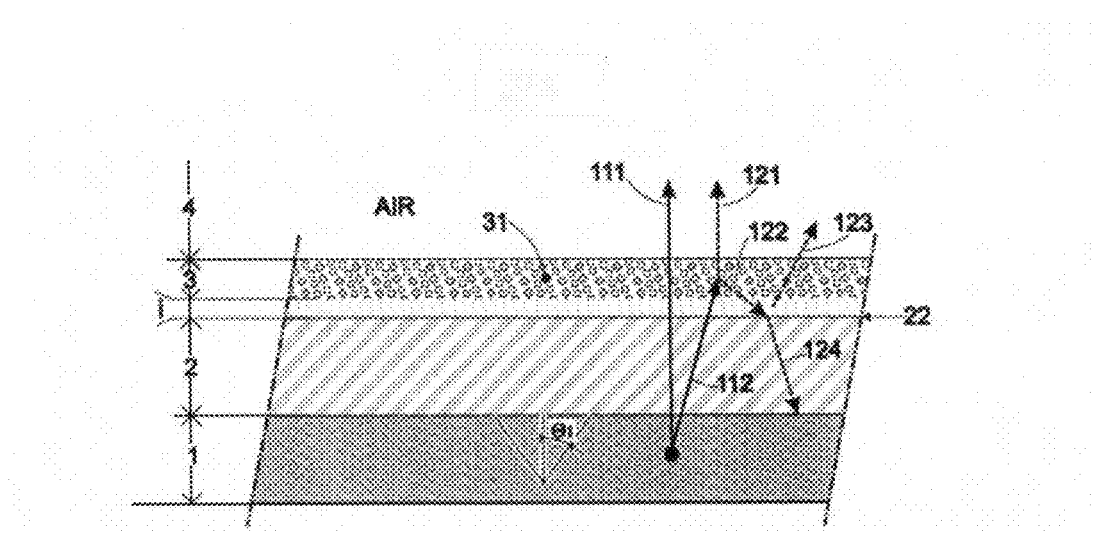
FIG. 3 illustrates the operating principle and the structure of a white LED component according to an exemplary implementation of the invention which makes it possible to obtain a better extraction of the light produced.

FIG. 3 illustrates the operating principle of an exemplary LED component according to the invention with the aid of a cross-sectional view showing the different layers of a structure making it possible to improve the extraction efficiency of the light produced.

Figure 2:
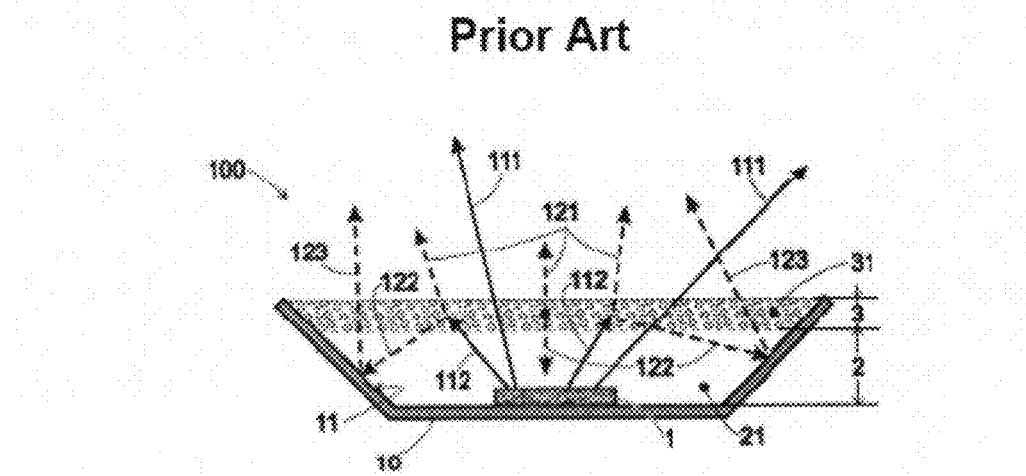
FIG. 2 describes a conventional implementation of an LED component emitting a white light and including a transported conversion layer comprising luminophores made of a luminescent material.

By comparison with FIG. 2, the invention introduces a reflection layer situated between the chip and conversion layer 3 comprising luminophores. This layer is marked (i) below. It has as a purpose, if not canceling, at the very least substantially limiting the return and reabsorption by chip 1 of the part of the secondary radiation that is reemitted in this direction by luminophores 31 of this layer. Reflection layer (i) therefore is placed between encapsulation layer 2 of chip 1 and conversion layer 3 forming the secondary source. The essential function of the reflection layer is, as will be seen, to further the total reflection toward the outside of the device, of the secondary radiation at interface 22 between layer (i) and layer 2. It also is adapted for allowing primary radiation 111, 112 to pass. It is recalled that in a geometric perspective, there usually is described as total reflection the phenomenon that occurs when a ray of light arrives at an interface formed by two mediums of different optical indexes n1 and n2 with an angle of incidence greater than the angle of total reflection Arcsin(n2/n1), the angle of incidence being formed by the direction of the ray and the normal to the plane defined by the interface. Beyond this angle of total reflection, the incident rays no longer are transmitted and are all reflected.

The primary light source is LED chip 1. It is a matter, for example, of an LED chip the semiconductor of which typically is gallium nitride (GaN) the index of refraction of which is 2.4. As was seen above, this type of LED chip emits a blue light in a wavelength range typically centered on 450 nm. A part of incident radiation 111 is transmitted and extracted directly from the device. The other part 112 is going to interact with luminophores 31 of conversion layer 3.

Before reaching conversion layer 3, the primary radiation first goes through encapsulation layer 2 of chip 1. This layer therefore consists of a material transparent to this radiation and has a low index of refraction so as to be able to form, with reflection layer (i) the index of refraction of which is higher, a reflective interface 22 for radiation 122 which is reemitted by conversion layer 3 toward the inside of the device. The material of layer 2 is for example a silicone polymer the index of refraction of which amounts to 1.4. Primary radiation 111, 112 also goes through reflection layer (i) which therefore also must be transparent to the primary radiation and the other characteristics of which are discussed below.

The layer of luminescent material, which constitutes the secondary light source, therefore absorbs part 112 of the incident radiation that is not transmitted directly toward the outside and reemits a radiation of different wavelength, typically greater, than the wavelength of the primary radiation. As was seen on FIG. 1, with a blue primary source, the secondary source is chosen so as to reemit in the complementary color: yellow. The converted radiation is reemitted for half 121 toward the outside and contributes directly to the light radiation generated by the device. The other half 122 is reemitted toward the inside of the device. It is this half of the converted radiation that for the most part is going to be reflected at interface 22 between layer (i) and layer 2. Only a small residual fraction 124 of the converted radiation reemitted toward the inside of the device will reach as far as LED chip 1 to contribute marginally to overheating thereof.

The method of the invention, which is going to be described in FIGS. 5a to 5g below, in fact makes it possible to create an interface 22 between reflection layer (i) and encapsulation layer 2, which has a specular, or almost specular, nature, for the part of converted radiation 122 reemitted toward the inside of the device. This interface 22 maximizes reflection 123 of this radiation toward the outside, in this way contributing to the luminous efficiency of the device. Interface 22 is more efficient the lower the residual fraction 124 of the radiation, in this way maximizing extraction of light from the device and minimizing overheating of chip 1.

The addition of a reflection layer (i) makes it possible to achieve these results by having the following characteristics:

Layer (i) is transparent to the primary radiation and also to the secondary radiation so that the specular reflection takes place at interface 22 with encapsulation layer 2.

Layer (i) is optically homogeneous. It preferably is monolithic, that is to say that it is formed with a sole material and preferably formed from a sole layer of this sole material. According to another embodiment, it is formed from a stack of materials the optical indexes of which are equal, thus maintaining the optical homogeneity of the reflection layer. Layer (i) has an index of refraction such that index $n_i$ of layer (i) is greater than index of refraction $n_2$ of layer 2. This condition is necessary so that there actually may be total reflection of a part of radiation 122, reemitted from conversion layer 3 toward the inside of the device, at interface 22 between these two layers.

The specular reflection behavior of interface 22 is achieved by having a good flatness of the surface characterized by an average roughness the amplitude of which is very small considering the wavelength ($\lambda$) of the light to be reflected, that is to say the yellow secondary radiation in this case, divided by the index of refraction of the encapsulation layer ($n_2$). The average roughness of interface 22 preferably is less than 10 nm. The method of the invention, described in FIGS. 4a and 4f below, makes it possible to achieve this objective which imparts a specular reflection behavior to interface 22.

In this invention, it is considered that the contact between encapsulation layer 2 and reflection layer (i) is sufficiently close so that the faces of these two layers 2 (i), which are opposite, have more or less the same roughness. This common roughness defines the roughness of interface 22.

It also will be noted that the reflection efficiency, linked to the total reflection at the interface between the reflection layer and the encapsulation layer, is all the greater as the $n_1/n_2$ ratio is large and $n_3$ is close to $n_i$. In the optimum case or $n_3=n_i$, the light fraction undergoing a total reflection at interface 2/i is equal to $\cos(\arcsin(n_2/n_i))$. For example, for $n_i=n_3=2.1$ and $n_2=1.4$, all the photons arriving at the interface between encapsulation layer 2 and reflection layer (i) with an incidence greater than $\theta=\text{Arcsin}(1.4/2.1)=42°$, are reflected at this interlace 2/(i). Considering a secondary isotropic emission, that corresponds to approximately 75% of the secondary radiation reemitted toward chip 1 which will be reflected by interface 22. In this way, the reflection is total for all the rays reaching interface 2/(i) with an angle of incidence greater than a given angle. It is only partial if all the rays together are considered, irrespective of their angle of incidence.

The layer of luminescent material, if it is optically homogeneous, must have an index of refraction ($n_3$) such that $n_3$ is greater than or equal to $n_2$. If, as is the case more often than not, conversion layer 3 is composite and made of coated luminophores for example, as already mentioned above, in an organic polymer matrix, it is the index $n_m$ of this matrix which then must be greater than $n_2$, the index of the encapsulation layer.

The efficiency of the device decreases if the $n_3/n_i$ ratio is less than 1. In this case, refraction at interface (i)–3 compresses the angular distribution of the secondary emission close to the normal, and a smaller fraction of the emission arrives at interface (i)–2 with incidences beyond the angle of total reflection. This fraction amounts to $\cos(\arcsin(n_2/n_3))$. For example, if $n_3=1.8$ and $n_2=1.5$, only 50% of the secondary flux will be totally reflected at interface 2–(i). In this case, interface (3)/(i) advantageously is implemented so as to have a diffuse behavior, that is to say having a roughness Ra greater than 50 nm, so as to redistribute a larger fraction of the secondary light over angles of incidence greater than the angle of total reflection given by $\arcsin(n_2/n_i)$.

Finally, each layer is deposited with a thickness greater than the wavelength of the radiations considered, divided by the index of reflection of the layer in order to avoid interference phenomena which might occur in thin layers. The deposited layers typically are greater than 500 nm, that is to say 700/1.4.

It will be noted here that unlike the prior art cited in the section on the state of the art, where an optical filter, based on interference phenomena in a stack of layers with carefully controlled thicknesses, is used to reflect the secondary radiation toward the outside, the invention does not require being able to control the thickness of the deposited layers other than by specifying a minimal value. Which is very easily obtained with any one of the deposition methods currently used by the microelectronics industry.

It also will be observed that the introduction of reflection layer (i) makes it possible to be freed from the reflective quality of the interface with conversion layer 3 forming the secondary source. Conversion layer 3 typically contains luminophores of relatively large sizes; it then is impossible to have a sufficient optical quality, that is to say a low roughness, which would make it possible to achieve a specular reflection at this interface. In the mentioned prior art, US2009/0272996, the introduction of a spacing layer between conversion layer 3 and chip 1, which is not different in its principle from layer 2, if it in fact contributes to improvement of extraction efficiency, nevertheless cannot mean that the roughness of the interface is improved. On the contrary, the invention is freed from this limitation by introducing an additional optical reflection layer (i) which makes it possible not to have to impose any special criterion regarding the specular or diffusing nature of the interface between conversion layer 3 and reflection layer (i).

Finally, as is going to be seen below in FIGS. 4e and 4f, extraction of the light produced by the primary and secondary sources also may be maximized at the interface between conversion layer 3 and the environment, that is to say air 4. Several implementation options are described in these Figures.

FIGS. 4a to 4f illustrate the method that allows implementation of LED components 100, for example emitting a white light and the structure of which is in accordance with the operating principles of the invention set forth in the preceding Figure.

Figure 4A:
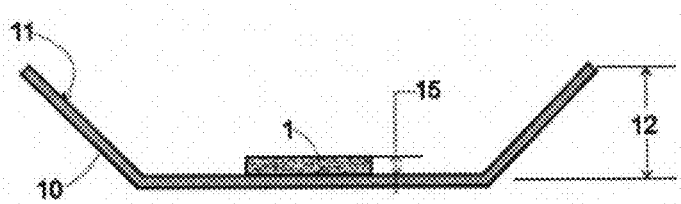
FIGS. 4a to 4f describe the steps of an exemplary manufacturing method for an LED component according to the invention.

FIG. 4a illustrates the first step in which a chip 1 is placed in a support 10. Support 10 typically forms a casing. It is, for example, made of ceramic and has a reflective metallized cavity 11. Chip 1 and the support may be specialized components which have been developed by a manufacturer for a specific application. This type of components also is available commercially from specialized manufacturers. With regard to LED chip 1, as already mentioned, it will be a matter of gallium-nitride (GaN)—or even gallium-and-aluminum (In-GaN)—based diodes which typically emit in a wavelength range centered on 450 nm. The company "Cree," the registered office of which is in the United States, 4600 Silicon Drive, Durham, N.C. 27703, supplies this type of devices, in a range of products known as "EZBright," manufactured from gallium and indium nitride. The support may come, for example, from the Japanese company "KYOCERA Corporation" the registered office of which is 6 Takeda, Tobadono-cho, Fushimi-ku, Kyoto, Japan. Using standard methods of the microelectronics industry, chip 1 is fixed in support 10 and interconnected electrically thereto (the interconnections are not shown on FIG. 4*a*). By way of indication, typical thickness 15 of chip 1 is on the order of about a hundred micrometers (micrometer or $\mu m = 10^{-6}$ meter) and the height 12 of the support is approximately 500 $\mu m$. These dimensions are not limitative of the invention and may vary in a broad range of values according to applications. The height of the support, for applications involving high powers, typically may reach up to 20 millimeters.

Figure 4B:
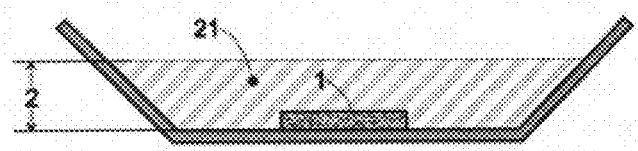

FIG. 4*b* illustrates the result of the second step after encapsulation layer 2 of chip 1 has been formed. Encapsulating material 21 used is, for example, a silicone-type transparent polymer available in liquid form. This type of material is available commercially for example from the company "NuSil Silicone Technology" the registered office of which is in the United States, 1050 Cindy Lane, Carpinteria, Calif. 93013, under the reference LS 3441. The index of refraction of this material is 1.4, which corresponds well to the purpose set for this layer, as discussed in the description of FIG. 3. The support cavity typically is filled to three-quarters of its height, or approximately at 375 $\mu m$, then the polymer is cross-linked. Through capillarity, cross-linking makes it possible to obtain a perfectly flat surface with a roughness Ra less than or equal to 40 nm and preferably less than or equal to 10 nm. Cross-linking of the polymer and its solidification are achieved for example thermally by heating the device.

Figure 4C:
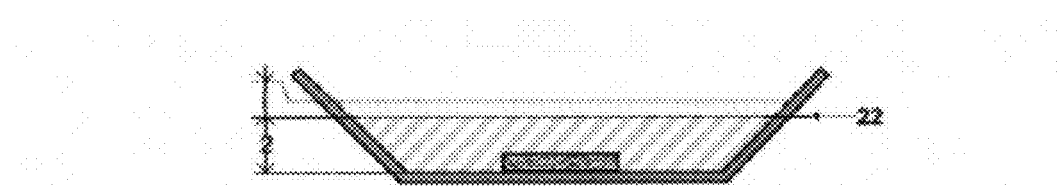

FIG. 4*c* illustrates the following step during which reflection layer (i) is formed. As was seen above, this layer preferably should have a high index of refraction ($n_i$) and, in any case, an index greater than that ($n_2$) of encapsulation layer 2 in order that specular reflection at interface 22 between these two layers may take place. The reflection will be greater the higher the index of the reflection layer. In order to deposit reflection layer (i), there preferably is used a "physical vapor-phase deposition" which brings together a combination of known methods under the general acronym of PVD, from the English "physical vapor deposition." A thin layer on the order of 500 nm of a material such as $TiO_2$, for example, is deposited by PVD under vacuum. Deposition of layer (i) also may be accomplished safely on the inside walls of the support forming the casing (not shown). This material indeed affords, as desired, a high index of refraction of 2.4.

Figure 4D:
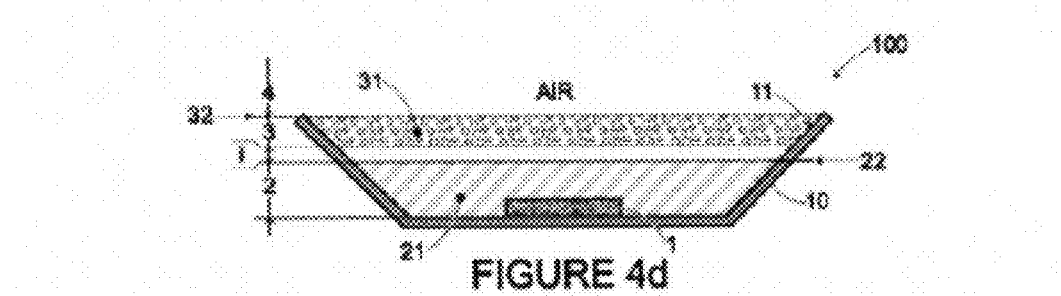

FIG. 4*d* shows the result of the following step in which deposition of conversion layer 3 is undertaken. It is a matter of depositing a luminescent material 31 such as, for example, the YAG described above. At the end of this deposition, the LED component 100 then is obtained.

Conversion layer 3 preferably consists of luminophores the characteristic size of which is micronic, advantageously in a broad range going from 0.05 to 50 $\mu m$ and preferably in a range from 1 to 10 $\mu m$. Particularly advantageously, the luminophores also may be nanophosphors the size of which is less than 500 nanometers and even more advantageously less than 100 nanometers. The luminophores are mixed with a silicone, for example of the type of those supplied by the company "NuSil Silicone Technology" already mentioned above, and in particular a silicone the reference of which is LS 3357 and the index of refraction of which amounts to 1.6. The mass proportion of luminescent material in the mixture preferably is, by weight, on the order of 15%. All the components of this layer have an index of refraction greater than that of encapsulation layer 2. Generally available in liquid form, the material of conversion layer 3 is for example dispensed into the supports forming the devices. Dispensing may be performed for example by syringe. Cross-linking and solidification of the material of conversion layer 3 are obtained thermally as for encapsulation layer 2.

At this stage of the description of the method, it should be observed that extraction of the primary and secondary radiations of LED component 100 toward the outside environment, air 4, also may be optimized if interface 32 of conversion layer 3 with air 4 of the outside environment is diffusing. In order to allow this interface to deviate as much as possible from a specular behavior and actually be diffusing, by widening the angle of diffusion of the light and making this diffusion as homogeneous as possible, the invention considers the use of the following two options illustrated by FIGS. 4*e* and 4*f.*

Figure 4E:
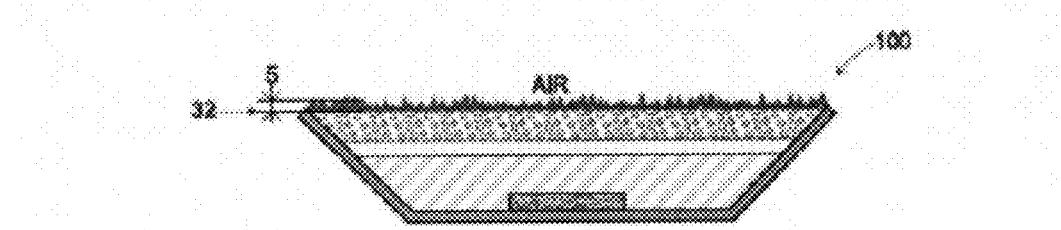

As shown in FIG. 4*e*, a first option consists in creating a strong structuring 5 of interface 32 of LED component 100 in order to have a roughness the amplitude of which is typically greater than 50 nm. This structuring is achieved for example with the aid of one or the other of the following methods:

If the size of the luminophores is considerably greater than 10 nm, for example greater than 50 nm, then the interface is self-diffusing and it is not necessary to create an additional structuring.

by application of a rough mold to the surface during the step of cross-linking conversion layer 3.

or then by a chemical or plasma etching method.

Figure 4F:
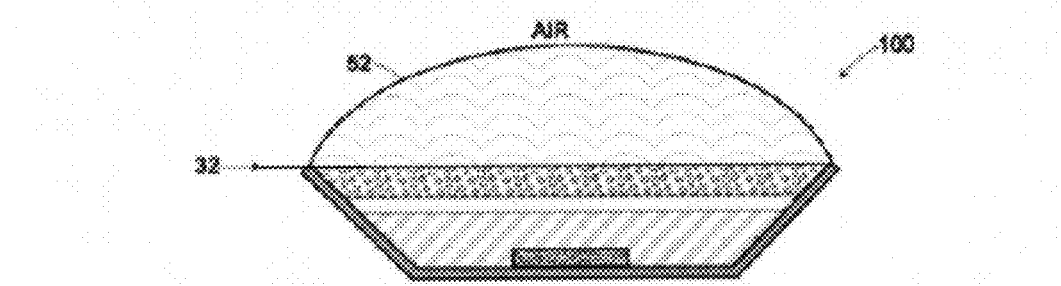

FIG. 4*f* describes a second option in which there is applied on LED component 100 a transparent hemispherical lens 52 of glass or of inorganic polymer material through bonding by means of a silicone-type material such as for example the one bearing the reference LS 6257 of the company "NuSil Silicone Technology" already mentioned.

In addition to the specific examples that have just been described, the invention also covers many variants a non-limitative list of which is indicated below:

a step in which structuring of interface (i)/(3) is achieved by a plasma etching or chemical etching method adapted to the constituent material of layer (i) or even a polishing method so as to achieve a roughness Ra greater than 50 nm in order to impart a diffusing nature to interface (i)/(3).

according to the desired characteristics of the light source, chip 1 constituting the primary source may emit in a range of wavelengths other than that which served to illustrate the invention (in the blue, around 450 nm). In particular, primary source 1 may extend from the ultraviolet to the visible spectrum for example in a range of wavelengths going from 200 to 800 nm. The semiconductor material making up the LED chip may be based on semiconductor materials other than those cited, that is to say gallium nitride (GaN) and indium and gallium nitride (InGaN). Aluminum nitride (AlN), aluminum and gallium nitride (AlGaN) as well as the following materials: InAlGaN, GaP, GaAsP, InGaAlP, are suitable. In particular zinc oxide (ZnO) is a material that is suitable.

It will be noted that the active zone of the LED chip ordinarily may be in the form of layers but also in the form of nanofilaments.

Support 10 preferably will have a cavity with reflective metal walls or made of a reflecting polymer. Support 10 also may be without a cavity as in the examples of FIGS. 5 and 6 which show supports 10 respectively forming a flat casing and a convex casing. In these last two embodiments, the different layers preferably are molded in a mold added onto support 10. All the device characteristics and method steps described for the embodiment with concave support are applicable to and may be combined with these two embodiments.

Figure 5:
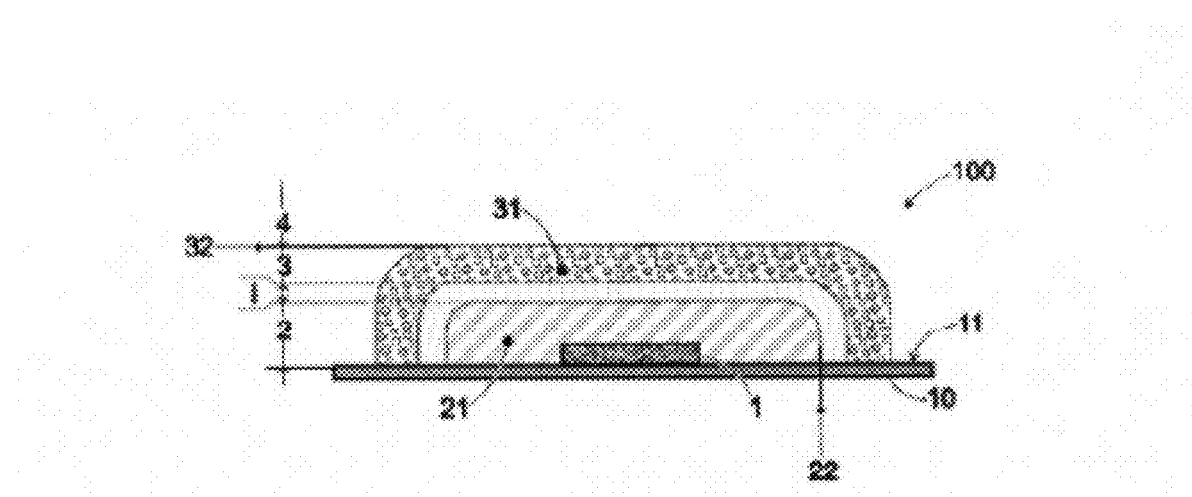
FIG. 5 illustrates the implementation of an LED component according to the invention with a flat support.

The embodiment illustrated on FIG. 5, in which support 10 accommodating LED chip 1 is flat, has for an advantage being particularly simple to implement and resulting in a reduced procurement cost.

Figure 6:
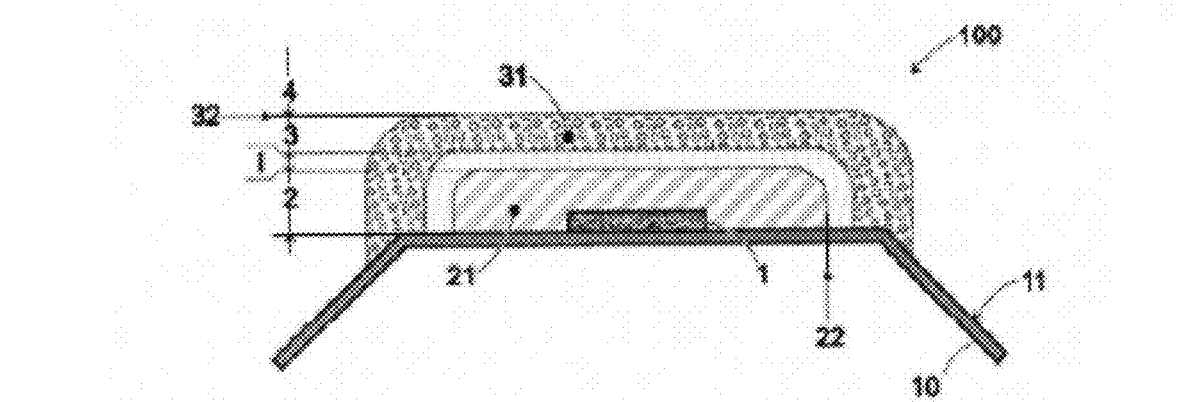
FIG. 6 illustrates the implementation of an LED component according to the invention with a convex support.

The embodiment illustrated on FIG. 6, in which support 10 accommodating LED chip 1 is convex, advantageously makes it possible to emit light in a broadened emission angle interval. This interval is in fact greater than 180 degrees since on both sides of LED chip 1 it is possible to emit beyond the plane on which LED chip 1 rests. Preferably, conversion layer 3 rests at least in part on convex portions of support 10. A light source the emission indicator of which is greater than 180° then is obtained.

Chip 1 then preferably is fixed on a flat ceramic or metal base comprising the necessary electrical interconnection layers. In this case conversion layer 3 of luminescent material forms a dome above LED chip 1. This dome may be of rectangular, hemispherical or other shape.

In this case, an exemplary embodiment is described below.
A step of depositing the conversion layer into a mold the inner shape of which corresponds to the shape wished to be given to conversion layer 3 is performed. On the illustrated example, the mold therefore has an inner dome shape. Seen from above, the dome may have a circular, rectangular, square, triangular, polygonal, etc. shape. Reflection layer i then is deposited on conversion layer 3. Then the layer of encapsulating material is deposited on reflection layer i. Preferably the materials forming the conversion, reflection and encapsulation layers are liquid and are poured to form layers 3, i and 2. An assembly comprising LED chip 1 positioned on support 10 furthermore is formed. This assembly then is added into the stack so as to immerse the LED chip in encapsulation layer 3.

Finally, a step for coagulating, for example by cross-linking, the structure obtained in this way is performed.

Typically, during formation of the stack of layers, the different layers are deposited by gravity into the mold beginning with conversion layer 3 which therefore is the lower layer. After the step of transferring LED chip 1 into the stack of layers and preferably after the step of cross-linking, the structure is pivoted 180° in order to obtain the structure illustrated on FIG. 5 or 6.

It should be ascertained that interface (i)/2 formed by reflection layer i and encapsulation layer 2 has a low roughness as explained above. For this purpose, special attention will be brought to bear on the size of the particles of conversion layer 3 so that reflection layer (i) has a roughness Ra lower than 50 nm. If particles 31 of conversion layer 3 have an overly large granulometry and conversion layer 3 is deposited first, then the following layer, that is to say reflection layer i, is going to follow the reliefs of the surface of conversion layer 3. Reflection layer i then may well have a roughness greater than 50 nm if the granulometry of the particles of layer 31 is overly large. Luminescent particles the size of which is less than 10 micrometers, or even less than 1 micrometer, or even less than 10 nanometers then will be favored.

encapsulating material 21 may be, for example, an organic polymer of silicone, epoxy or acrylic type but also an inorganic material such as a glass. The index of refraction typically will be included in a range going from 1.4 to 1.8.

The material forming transparent reflection layer (i) should have an index of refraction as high as possible. It preferably is clearly higher than that of material 21 of encapsulation layer 2 so as to have the broadest fraction of the secondary radiation reflected at interface 22 by total reflection. Reflection layer (i) advantageously may use inorganic materials obtained by depositions in thin layers with the aid of a technique known as PVD, already mentioned, and also by CVD, acronym for the English "chemical vapor deposition," that is to say "vapor-phase chemical deposition." The following materials are suitable: zinc sulfide (ZnS), zinc oxide (ZnO) or titanium oxide ($TiO_2$), which have an index of refraction of approximately 2.4. Tin and indium oxide (ITO), indium oxide ($In_2O_3$), zirconium oxide ($ZrO_2$), hafnium oxide ($HfO_2$), silicon nitride ($Si_3N_4$), and tantalum oxide ($Ta_2O_5$), the indexes of refraction of which range approximately between 2 and 2.2 also may be suitable, alone or in the form of a co-deposition of several of these materials. As was seen, the thickness of the reflection layer preferably should be greater than 400 nm. It advantageously remains below 1 µm in particular for semiconductor materials such as ZnS, ITO, $ZrO_2$ or $In_2O_3$ which are partially absorbent for the wavelengths considered. Other methods such as electrolysis may be used if need be for depositing materials such as zinc oxide (ZnO). Finally, even if it is technologically more complex, it is possible to implement this intermediate layer with a composite comprising an organic matrix of silicone for example and the addition of nanoparticles, with dimensions less than 50 nm, in the same materials mentioned above, imparting an optically homogeneous nature to this layer.

Layer 3 forming the secondary source contains a luminescent material for conversion of the primary wavelength in the form of luminophores. As mentioned above, the most common is cerium-doped yttrium and aluminum garnet (YAG:Ce). Nevertheless there is a great variety of yellow, green or even red luminophores which also may be used according to the applications of the invention so as to obtain the desired colorimetric properties. Advantageously, the index of this layer will be the highest possible and in any case greater than that of encapsulation layer 2. Ideally it will be equal to or greater than the index of the reflection layer. YAG:Ce has an index of 1.8 and the majority of the luminescent materials have an index of refraction greater than this value. It is possible to increase the actual index of the matrix of conversion layer 3 by adding nanoparticles of a high-index material as mentioned above. For example, it is possible to use a silicone polymer charged with particles of TiO2, $ZrO_2$, ZnO and ZnS.

In this way, the objectives of the invention are achieved with a simple and inexpensive method for producing an LED component, for example white, which nevertheless makes it possible to optimize extraction of the primary radiation coming from the LED chip and of the radiation converted by the layer of luminescent material. The invention makes it possible to obtain a component having a low geometry factor the size of which does not exceed, by a factor of more than two to three, the size of chip 1 necessary for generation of the primary radiation.

Moreover, the invention makes it possible to dissociate the specular function of the interface where the total reflection of the radiation reemitted by the conversion layer toward the chip is sought, and the conversion/diffusion function of the layer of luminescent material. In this way, the criteria specific to the conversion layer are not determined by this constraint. It therefore is not necessary to use nanparticles for this layer as is the case in the prior art cited in the section on the state of the art, in this way meeting an objective of the invention of having a simple and inexpensive manufacturing method.

Advantageously, it no longer is necessary to delicately control the thickness of the material layers constituting the LED component, unlike solutions of the prior art based on a reflection by interferences effect where it is necessary to be able to precisely control the thicknesses.

The invention is not limited to the embodiments described above and extends to any embodiment in keeping with the spirit thereof.

The invention claimed is:

1. A light-emitting diode component comprising:
    at least one primary source configured to emit a primary radiation when said primary source is electrically activated;
    at least one conversion layer forming a secondary source configured to absorb, at least in part, the primary radiation and to emit a secondary radiation;
    at least one encapsulation layer contacting the primary source and configured to allow the primary radiation emitted by the primary source toward the secondary source to pass; and
    an optically homogeneous reflection layer, disposed between the encapsulation layer and the conversion layer, having a first face in contact with the conversion layer and a second face in contact with the encapsulation layer, the second face of the optically homogeneous reflection layer forming an interface with the encapsulation layer,
    wherein the optically homogeneous reflection layer and the encapsulation layer are configured so that said interface allows the primary radiation originating from the primary source to pass and so that rays of the secondary radiation emitted toward said interface and arriving on said interface with an angle greater than $\text{Arcsin}(n_2/n_i)$ in relation to a perpendicular line to said interface are reflected by total reflection, and
    wherein $n_2$ and $n_i$ are respective indexes of refraction of the encapsulation layer and the optically homogeneous reflection layer.

2. The light-emitting diode component according to claim 1, wherein the optically homogeneous reflection layer and the encapsulation layer are configured so that the index of refraction $n_i$ of the optically homogeneous reflection layer is greater than the index of refraction $n_2$ of the encapsulation layer and so that the second face of the optically homogeneous reflection layer in contact with the encapsulation layer has a roughness Ra less than 50 nm.

3. The light-emitting diode component according to claim 2, wherein the second face of the optically homogeneous reflection layer in contact with the encapsulation layer has the roughness Ra less than 5 nm.

4. The light-emitting diode component according to claim 2, wherein the optically homogeneous reflection layer and the encapsulation layer are configured so that $n_i/n_2 > 1.2$.

5. The light-emitting diode component according to claim 4, wherein the optically homogeneous reflection layer and the encapsulation layer are configured so that $n_i/n_2 > 1.4$.

6. The light-emitting diode component according to claim 1, wherein the conversion layer forming the secondary source and the optically homogeneous reflection layer are configured so that an index of refraction $n_3$ of the conversion layer is greater than the index of refraction $n_i$ of the optically homogeneous reflection layer.

7. The light-emitting diode component according to claim 1, wherein the optically homogeneous reflection layer is made of a material taken from among: zinc sulfide (ZnS), zinc oxide (ZnO), titanium oxide ($TiO_2$), tin and indium oxide (ITO), indium oxide ($In_2O_3$), zirconium oxide ($ZrO_2$), hafnium oxide ($HfO_2$), silicon nitride ($Si_3N_4$) and tantalum oxide ($Ta_2O_5$).

8. The light-emitting diode component according to claim 1, wherein the encapsulation layer is made of a material taken from among: an organic polymer comprising silicone, epoxy or acrylic or an inorganic material comprising glass.

9. The light-emitting diode component according to claim 1, wherein the conversion layer includes a cerium-doped yttrium and aluminum garnet (YAG:Ce) and the primary source includes a light emitting diode chip including a material taken from among: gallium nitride (GaN), indium and gallium nitride (InGaN) and zinc oxide (ZnO).

10. The light-emitting diode component according to claim 1, wherein a thickness $e_2$ of the encapsulation layer, a thickness $e_i$ of the optically homogeneous reflection layer and a thickness $e_3$ of the conversion layer are such that $e_2 > \lambda/n_2$, $e_i > \lambda/n_i$, $e_3 > \lambda/n_3$, $n_2$, $n_i$ and $n_3$ being respectively the indexes of refraction of the encapsulation layer, of the optically homogeneous reflection layer and of the conversion layer, and $\lambda$ being the highest wavelength of a wave range of the primary radiation.

11. The light-emitting diode component according to claim 1, wherein a thickness of the encapsulation layer ranges between 0.5 μm and 5 mm.

12. The light-emitting diode component according to claim 1, wherein a thickness of the optically homogeneous reflection layer ranges between 0.4 μm and 5 μm.

13. The light-emitting diode component according to claim 1, wherein the conversion layer includes an outer face turned towards an outside of the light-emitting diode component, the outer face having a roughness greater than 50 nm.

14. The light-emitting diode component according to claim 1, wherein the conversion layer includes an outer face turned towards an outside of the light-emitting diode component and the light emitting diode component further comprises a hemispherical lens disposed between said outer face and the outside.

15. The light-emitting diode component according to claim 1, wherein the primary source, the encapsulation layer and the optically homogeneous reflection layer are accommodated in a cavity.

16. The light-emitting diode component according to claim 15, wherein the cavity is formed by a support having reflective inside walls.

17. The light-emitting diode component according to claim 15, wherein the cavity is formed by the secondary source.

18. The light-emitting diode component according to claim 1, wherein the primary source rests on a support having a convex shape or a flat shape.

19. The light-emitting diode component according to claim 1, wherein the conversion layer includes luminophores, a size of the luminophores being less than 50 micrometers.

20. The light-emitting diode component according to claim 19, wherein the size of the luminophores is less than 1 micrometer.

21. A system comprising at least one light-emitting diode component according to claim 1.

22. A method for manufacturing a light-emitting diode component comprising:

disposing at least one primary source configured to emit a primary radiation when said primary source is electrically activated;

disposing at least one conversion layer forming a secondary source configured to absorb the primary radiation at least in part and to emit a secondary radiation;

disposing at least one encapsulation layer between the primary source and the secondary source, the encapsulation layer being configured to allow the primary radiation emitted by the primary source toward the secondary source to pass and the encapsulation layer being in contact with the primary source; and disposing an optically homogeneous reflection layer between the encapsulation layer and the conversion layer so that one face of the optically homogeneous reflection layer is in contact with the conversion layer and another face of the optically homogeneous reflection layer is in contact with the encapsulation layer, the another face of the optically homogeneous reflection layer forming an interface with the encapsulation layer, the optically homogeneous reflection layer and the encapsulation layer being chosen so that said interface allows the primary radiation originating from the primary source to pass and so that rays of the secondary radiation emitted toward said interface and arriving on said interface with an angle greater than $\mathrm{Arcsin}(n_2/n_i)$ in relation to a perpendicular line to said interface are reflected by total reflection, and $n_2$ and $n_i$ being respective indexes of refraction of the encapsulation layer and the optically homogeneous reflection layer and $n_i$ being greater than $n_2$.

23. The method according to claim 22, further comprising: fixing the primary source on a support;

dispensing in liquid form and cross-linking the encapsulation layer;

forming the optically homogeneous reflection layer; and dispensing in liquid form and cross-linking the conversion layer.

24. The method according to claim 23, wherein the forming the optically homogeneous reflection layer includes depositing a material forming the optically homogeneous reflection layer by vapor phase chemical or physical process (PVD or CVD) onto the encapsulation layer.

25. The method according to claim 22, wherein the disposing the conversion layer, the optically homogeneous reflection layer and the encapsulation layer respectively includes disposing the conversion layer into a mold, disposing the optically homogeneous reflection layer onto the conversion layer, and disposing the encapsulation layer onto the optically homogeneous reflection layer, the method further comprising transferring an LED chip into a layer of the encapsulation layer.

26. The method according to claim 25, further comprising fixing the LED chip on a flat or convex support prior to the transferring the LED chip into the layer of the encapsulation layer.

27. The method according to claim 22, further comprising increasing a roughness at the interface between the conversion layer and the optically homogeneous reflection layer so as to obtain a roughness Ra greater than 50 nm.

28. The method according to claim 27, wherein the increasing of the roughness at the interface between the conversion layer and the optically homogeneous reflection layer includes at least a plasma etching and/or a chemical etching.

29. The light-emitting diode component according to claim 1, wherein the index of refraction $n_i$ of the optically homogeneous reflection layer is greater than the index of refraction $n_2$ of the encapsulation layer.

* * * * *